United States Patent [19]

Harvey et al.

[11] Patent Number: 4,904,087
[45] Date of Patent: Feb. 27, 1990

[54] METHOD FOR ALIGNING PHOTOMASKS

[75] Inventors: George T. Harvey, Princeton; Laurence S. Watkins, Pennington, both of N.J.

[73] Assignees: American Telephone & Telegraph Co., AT&T Bell Laboratories, Murray Hill, N.J.; American Telephone & Telegraph Company, New York, N.Y.

[21] Appl. No.: 274,215

[22] Filed: Nov. 21, 1988

Related U.S. Application Data

[62] Division of Ser. No. 69,901, Jul. 6, 1987, Pat. No. 4,835,078.

[51] Int. Cl.$^4$ ............................................. G01B 11/00
[52] U.S. Cl. ..................................... 356/400; 250/548
[58] Field of Search ........................ 356/400, 401, 399; 250/548, 557; 318/64

[56] References Cited

U.S. PATENT DOCUMENTS 4,037,969  7/1977  Feldman et al. ................... 356/400
4,761,561  8/1988  Fujiwara et al. .................. 250/548

*Primary Examiner*—F. L. Evans
*Attorney, Agent, or Firm*—Roderick B. Anderson

[57] ABSTRACT

Photomasks (11, 12) are aligned on opposite sides of a wafer by directing light beams through zone plates (13 A–C) in one photomask and through aligned transparent slits (14 A–C) on the other photomask. Simulantaneous detection of the beams by photodetectors (18 A–C) indicates alignment. A method for obtaining precise centering by scanning the slits with the beams, sampling light transmitted through the slits, and fitting the samples to a parabola by the use of a computer (27) is also described.

8 Claims, 4 Drawing Sheets

METHOD FOR ALIGNING PHOTOMASKS

This is a division of application Ser. No. 069,901 filed July 6, 1987, now U.S. Pat. No. 4,835,078.

TECHNICAL FIELD

This invention relates to mask aligning methods, and, more particularly, to methods for aligning photolithographic masks (photomasks) on opposite sides of a flat workpiece.

BACKGROUND OF THE INVENTION

Photolithographic masking and etching is widely understood because of its extensive use in the fabrication of integrated circuits. In such processes, a semiconductor wafer is coated with a thin layer of photoresist material and is exposed to actinic light through a patterned photomask. After development, the photoresist coating itself acts as a mask to permit selective processing, such as selective etching, of the wafer.

It has been found that the same process is useful for making optic fiber connectors from silicon wafers. Each connector comprises a silicon chip having grooves on opposite sides which are used to contain optic fibers and to align the connector. Since the alignment of optic fibers for lightwave transmission is extremely critical, it is important the the support grooves be accurately located to within tolerances that are typically less than one micron. For this reason, in the fabrication of such connectors, it is critical to align accurately photomasks on opposite sides of a semiconductor wafer that has been coated with photomas material.

The U.S. Pat. No. 3,963,489, of K. H. Cho, issued June 15, 1976, is an example of prior art teachings of methods of aligning photomasks on opposite sides of a semiconductor wafer. The Cho technique uses indexing indicia on corresponding portions of the two photomasks that overlap the wafer contained between them. By properly aligned these indicia, one aligns the mask patterns of the two masks with respect to the intervening semiconductor wafer.

A problem with using a scheme such as this for aligning masks with submicron tolerances is that a sufficiently high-power microscope for making the alignment will normally have a smaller depth of field than the separation of the two masks. Thus, the operator cannot see both alignment indicia simultaneously during the alignment operation. One way of meeting this problem would be to align the two masks while they are in close contact and then separate them to incorporate the wafer. In practice, it has been found to be extremely difficult, if not impossible, to make the required mechanical separation while maintaining the required close tolerances.

SUMMARY OF THE INVENTION

In accordance with the invention, these problems are solved by making a plurality of zone plates on the periphery of one of the masks and a plurality of transparent slits on the periphery of the other mask, each slit being aligned with a corresponding zone plate. The masks are then conveniently aligned on opposite sides of a wafer by directing collimated light through one of the zone plates and then moving the masks relative to each other until the light beam focused by the zone plate is transmitted through a corresponding transparent slit. Three zone plates with corresponding transparent slits may be used for aligning the mask in X,Y and angular (or $\theta$) directions.

Transmission of the light beam through a transparent slit is conveniently detected automatically by a light detector, As will be explained in more detail below, a high degree of alignment accuracy can be obtained by scanning the light beam across the transparent slit, making three light intensity measurements during the scan and using a computer to fit the three intensity points to a parabolic curve. The computer can then determine the maximum of the parabolic curve, which will then correspond to the center of the transparent slit and move the mask relative to the light beam to get precise centering of the light beam on the slit.

These and other objects and features of the invention will be better understood from a consideration of the following detailed description taken in conjunction with the accompanying drawing.

DETAILED DESCRIPTION

Figure 1:
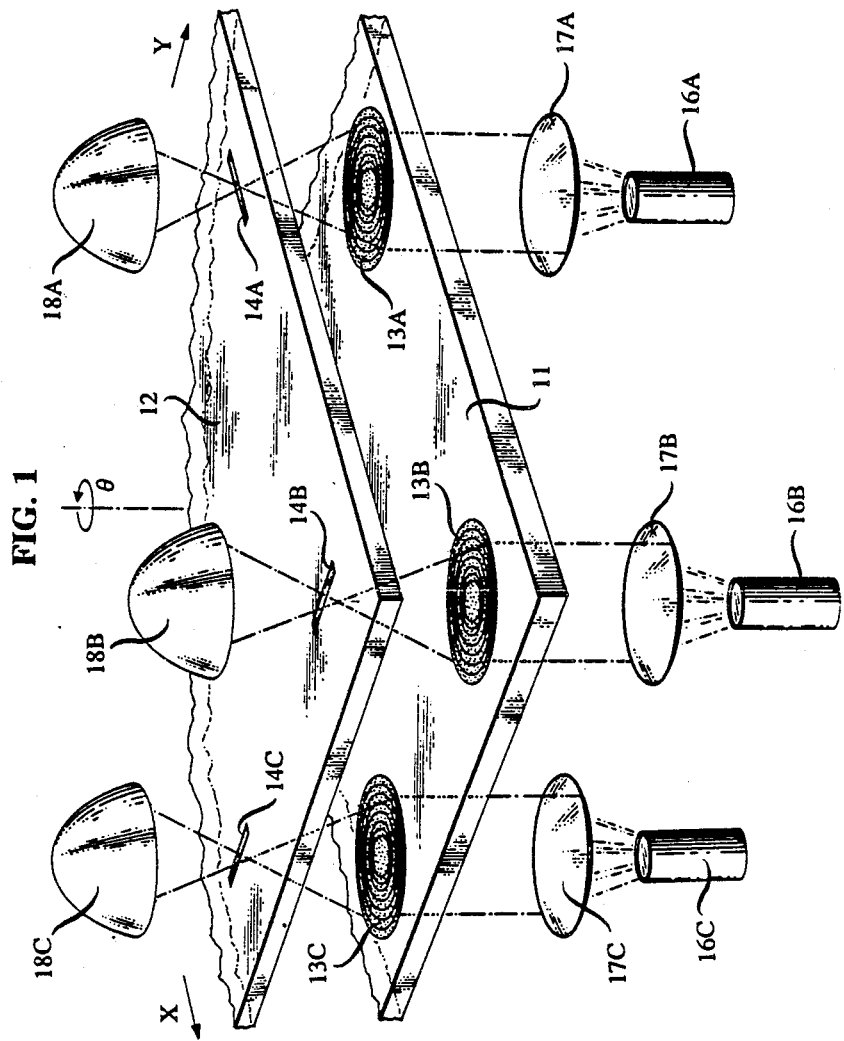
FIG. 1 is a schematic illustration of apparatus for aligning photomasks in accordance with one embodiment of the invention.

Referring now to FIG. 1, there are shown schematically first and second photomasks 11 and 12 for illustrating the general principles of the invention. For purposes of expediency, neither the pattern of the photomasks nor the wafer between them which is to be exposed has been shown. The only devices shown are those for aiding in mask alignment.

Arranged around a periphery of the lower photomask 11 are three zone plates 13A, 13B, and 13C. Aligned respectively with the zone plates on the upper photomask 12 are three transparent slits 14A, 14B, and 14C. As is known, zone plates are diffraction elements, which, when arranged in the shape of concentric circles, may act as circular lenses. Both the zone plates 13A-C and the transparent slits 14A-C may conveniently be made at the same time that the photolithographic mask patterns in the photomasks are made.

Light from light sources 16A-C, which may be optic fibers, is collimated by collimating lenses 17A-C and is directed through the zone plates 13A-C. The zone plates focus the light into beams which, when the masks are properly aligned, are transmitted through the corresponding transparent slits 14A-C.

In accordance with the invention, the masks are aligned by moving the upper photomask 12 in X,Y and $\theta$ directions relative to the lower mask 11 until the three focused beams are transmitted through the three slits 14A-C. Preferably, the upper photomask 12 is moved in a Y direction until focused light from zone plate 13A is transmitted through transparent slit 14A and detected by photodetector 18A. After initial detection, the photomask 12 may be slowly scanned in the Y direction to determine the position at which light transmitted through opening 14A is at a maximum. The position of maximum light power transmission of course indicates a precise centering of the transparent slit with respect to the light beam. The slits 14A–C have a long dimension transverse to the direction of scan during alignment. For example, slit 14A, used for Y direction alignment, has a long dimension in the X direction. Slits 14C and 14B are arranged along a line parallel to the Y axis.

After Y direction alignment, the upper photomask is scanned in the X-direction until light is initially detected by detectors 18B and 18C. An angular adjustment is made so that light is detected simultaneously by both detectors, 18B and 18C during a scan. Such adjustments may be made after repetitive slow X-direction scans to obtain maximum light power detection simultaneously by the detectors 18B and 18C, which indicates both X-direction and $\theta$ alignment. After alignment in all three directions, as indicated by maximum power output of all thru detectors 18A–C, masks 11 and 12 are fixed for exposure of the wafer.

Figure 2:
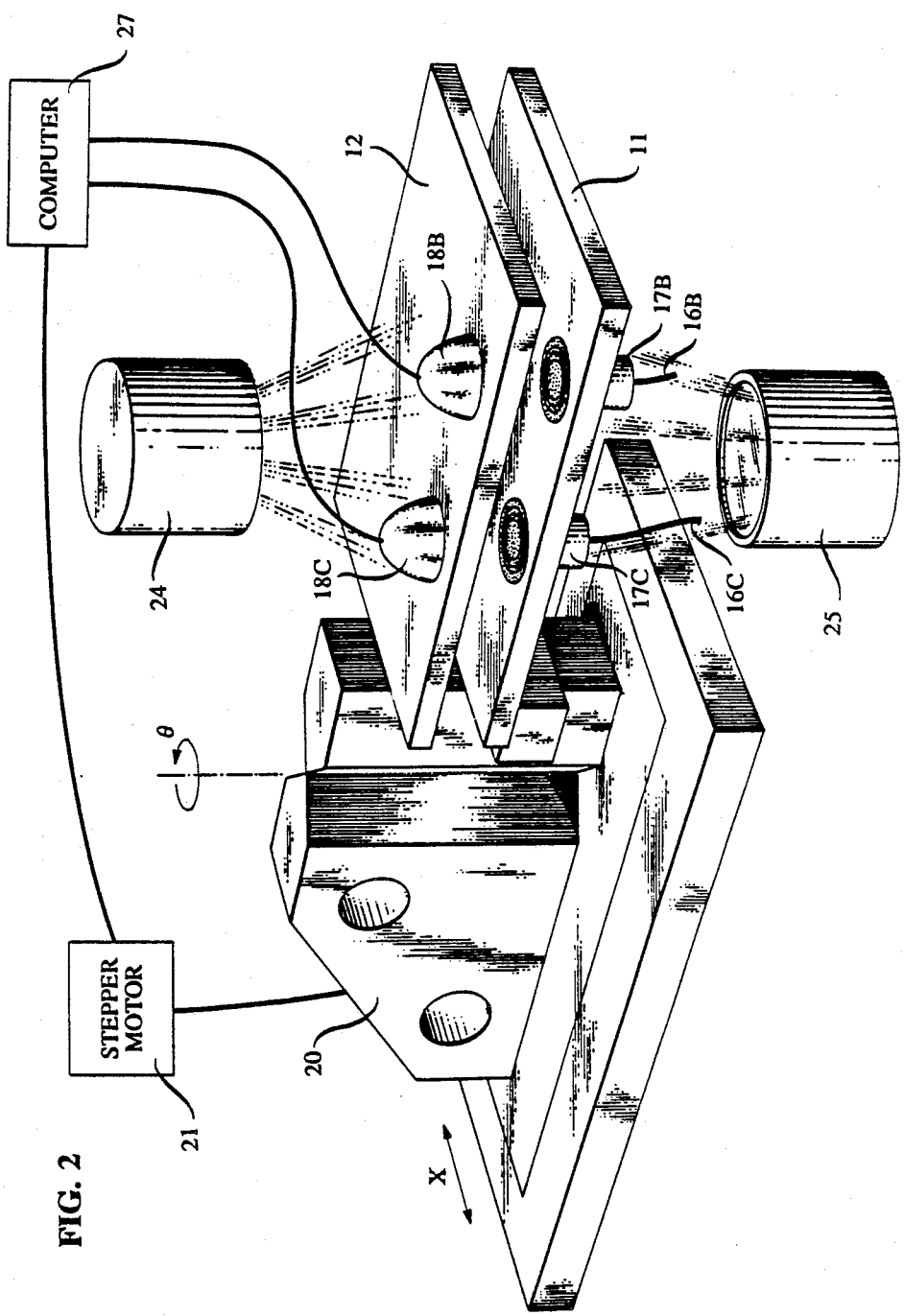
FIG. 2 is a schematic illustration of mask alignment and exposure apparatus in accordance with another embodiment of the invention.

FIG. 2 shows schematically a photomask alignment system in accordance with the invention that has been successfully used in the fabrication of optic fiber connectors. Elements having the same reference numbers as those of FIG. 1 perform the same functions and, for expediency, will not be further explained; however, it is the lower photomask that is actually moved into alignment, rather than the upper photomask as in FIG. 1.

A photomask holder 20 supports photomask 11 and is driven by a stepper motor 21 in X and $\theta$ directions as shown. Lenses 17B and 17C and optic fiber light sources 16B and 16C are fixed by an encapsulation to photomask 11 and are driven with it. Photomasks 11 and 12 are arranged on opposite sides of a silicon wafer (not shown) to be processed. The wafer is coated with a photoresist on top and bottom surfaces and both photomasks contain patterns to be transferred to the silicon wafer. After alignment, ultraviolet sources 24 and 25 expose the photoresist through the photomask to define patterns that are subsequently used to control etching of the silicon wafer. After masking and etching, the wafer is cut into chips that are thereafter used as optic fiber connectors.

The construction of holder 20 and the particular etching requirements for the wafer are such that the highly critical alignment capabilities of the invention are not required for alignment in the Y direction. Specifically, the apparatus is intended for the fabrication of optical fiber connectors which require grooves on opposite sides of a chip that are extremely accurately aligned in the X and $\theta$ directions for accurate intermeshing with the other elements. Notice that for $\theta$ alignment, the holder 20 is rotated about an axis that is removed from photomasks 11 and 12.

Figure 3:
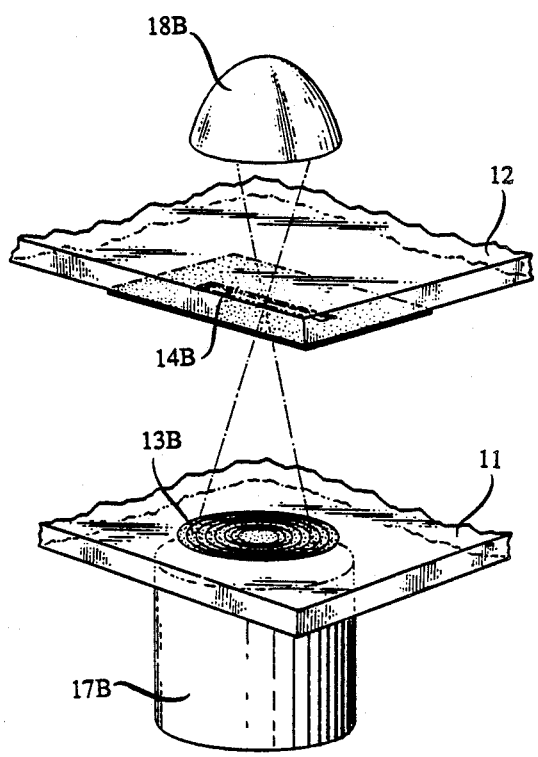
FIG. 3 is an expanded view of a portion of the apparatus of FIG. 2.

The photomasks, portions of which are shown in greater detail in FIG. 3, are essentially glass plates. The mask pattern and the transparent slits are formed on the lower surface of photomask 12, while the zone plates and lower photomask pattern are formed on the upper surface of photomask 11. Slit 14B and zone plate 13B are shown in FIG. 3. The transparent slits and the zone plates can conveniently be made by photolithographic masking and etching simultaneously with the formation of the mask patterns on photomasks 11 and 12 and by the same process.

The light sources 16B and 16C are optic fibers for transmitting light from a remote source and lenses 17B and 17C are glass lenses for collimating light from the optic fibers. The outputs of light detectors 18B and 18C are directed to a computer 27 which controls the stepper motor 21. The computer is programmed using known techniques, to align the masks automatically in accordance with the invention.

Figure 4:
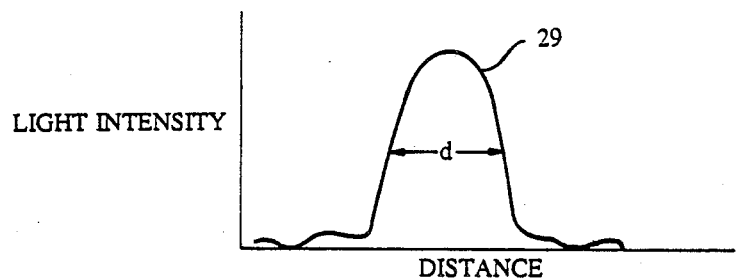
FIG. 4 is a graph of light intensity vs. distance generated by the light beam shown in FIG. 3.
Figure 5:
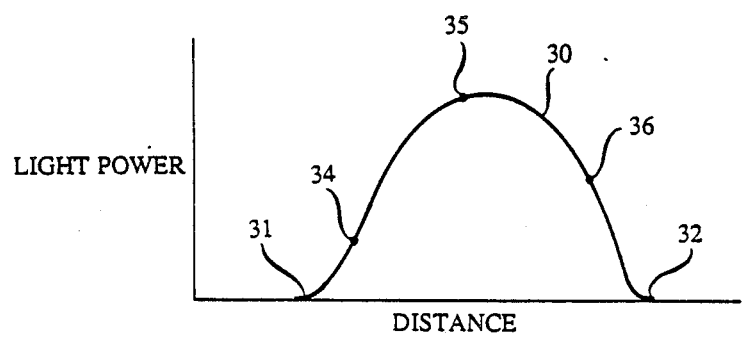
FIG. 5 is a graph of light power vs. distance as generated by the apparatus of FIGS. 2 and 3.

While the computer could be programmed to detect maximum light intensity through the slit, as has been described above, a more sophisticated method has been found for more accurately centering the slit on the focused beam. The light beam focused on the slit, or on the upper photomask 12 prior to alignment, has an intensity distribution as shown by curve 29 of FIG. 4. Curve 29, the light distribution resulting from zone plate focusing, is known in the art as an Airy function. The spot size is taken as the distance d between curve segments at one-half the maximum intensity. As the spot illustrated in FIG. 4 is scanned across the rectangular slit, the resultant light power, or integrated light intensity, detected by the photodetecter varies with distance, as shown by curve 30 of FIG. 5. Curve 30 is known mathematically as a convolution of the curve 29 of FIG. 4 and of the rectangular slit. Point 31 represents the distance along the scan at which light begins to enter the slit and point 32 is the point at the light beam leaves the slit. Since the spot has a finite width, the distance between 31 and 32 is somewhat greater than the actual width of the slit.

Detection of the precise maximum, as mentioned before, may be somewhat difficult because the rate of change of slope of the curve at its maximum is relatively small. Instead, after the slit has initially been detected, a slow stepped scan is made such that three equally spaced samples of light output are taken as the beam traverses the slit. The computer fits these samples to a parabolic function to determine the location of the central peak. The initiation of a subsequent scan is adjusted to make the function more centered, and the operation is iterated until centering is achieved.

With three samples, centering occurs when the two outer samples are equal. For example, assume that the set of samples taken during the first slow scan were points 34, 35 and 36. Since the value of point 34 is lower than point 36, the successive scan must be initiated at a location displaced slightly to the right. This will move point 34 "up the curve" and point 36 "down the curve." When the light power at points 34 and 36 is equal, then point 35 can be taken as being at the center of the slit and precise alignment is obtained. Such alignment is automatic and is made to tolerances of less than one micron.

During the rapid first scan for making the initial light detection, the scan steps were each 2.5 microns. The slit width was 0.5 microns. During the slow scan, each step was 1.5 microns, which was appropriate for giving three readings within the slit width. The one-half maximum spot size was 2.5 microns; however, the detectable spot size width was significantly larger.

The angular or $\theta$ alignment is done in conjunction with the X-direction alignment. The extent to which light is not detected simultaneously by the two detectors, and the order in which light is detected, indicates the magnitude and direction of angular misalignment. The computer is programmed to make a $\theta$ adjustment during both the fast scans and the slow scans. After each show scan, both the initial location of the successive scan and the angular location of the mask are adjusted and scanning is repeated until accurate centering of both beams on both slits is simultaneously obtained. After alignment, the masks are fixed on opposite sides of the wafer and exposures of both sides of the wafer by sources 24 and 25 are made.

The specific embodiments described are intended to be merely illustrative of the invention. Other radiative forms may be the functional equivalents of light beams. Relative movement of the beam with respect to the transparent slit implies that either the beam or the slit may be stationary. Various other modifications and embodiments may be made by those skilled in the art without departing from the spirit and scope of the invention.

What is claimed is:

1. A method for aligning first and second planar members, comprising the step of forming first and second light confining elements in the first planar member, forming first and second transparent openings, each of smaller width than length, in the second member so as to be approximately aligned, respectively, with the first and second light confining elements, locating first and second photodetectors, respectively, adjacent the first and second openings and opposite the first planar member, directing a first light beam through the first light confining member toward the second planar member, direction a second light beam through the second light confining member toward the second member, causing the first beam to scan the first opening in a direction traverse to the width of the first opening, causing the second beam to scan the second opening in a direction traverse to the width of the second opening, and causing movement of the second member relative to the first member until the first beam is transmitted through the first opening and is detected by the first light detector and the second light beam is simultaneously transmitted through the second opening and detected by the second detector.

2. The method of claim 1 wherein the light confining elements are zone plates.

3. The method of claim 1 wherein the second planar member is aligned with respect to the first member within tolerances of less than 1 micron.

4. The method of claim 1 wherein the first light beam originates at a first light source that is fixed to the first planar member and the second light beam originates at a second light source fixed to the first planar member.

5. The method of claim 4 wherein the first and second light sources are both sources of collimated light.

6. A method for aligning first and second members comprising the step of forming at least a first zone plate in a first planar member, forming at least a first transparent opening in the second member so as to be aligned with the first zone plate, locating at least a first photodetector adjacent the first opening and opposite the first planar member, directing at least a first light beam through the first zone plate toward the second member, moving the second member relative to the first member so as to cause the first light beam to scan the width of the first opening, making three equally-spaced measurements of light intensity through the first opening, after each scan changing the location of the initiation of the successive scan until two of the three measurements are substantially equal and the three measurements of light intensity vs. distance each substantially describe a parabola, and the parabola is used to center the first opening on the first beam.

7. The method of claim 6 further comprising the step of forming a second zone plate in the first member, forming a second transparent opening in the second member so as to be aligned with the second zone plate, locating a second photodetector adjacent the second opening and opposite the first member, directing a second light beam through the second zone plate toward the second planar member, and moving the second member relative to the first member to cause the second light beam to scan the width of the second opening, making three equally-spaced measurements of light intensity through the second opening, after each scan changing the location of the initiation of the successive scan until two of the three measurements are substantially equal and the three measurements of light intensity vs. distance each substantially describe a parabola, and the parabola is used to center the second opening on the second beam.

8. A method for aligning first and second planar members comprising the steps of forming first and second zone plates in the first planar member, forming first and second transparent openings in the second member so as to be approximately aligned, respectively, with the first and second zone plates, locating first and second photodetectors, respectively, adjacent the first and second openings and opposite the first planar member, directing a first light beam through the first zone plate toward the second planar member, directing a second light beam through the second zone plate toward the second member, causing the first and second light beams to make a plurality of scans of the widths of the first and second openings, making three equally-spaced measurements of light intensity through each opening, after each scan, changing the location of the initiation of the successive scan and the angular orientation of the second planar member until two of the three measurements are substantially equal and the three measurements of light intensity vs. distance each substantially describe a parabola, and using the parabolas to center, respectively, the first opening on the first beam and the second opening on the second beam.

* * * * *